United States Patent
Weng et al.

(10) Patent No.: US 10,962,165 B2
(45) Date of Patent: Mar. 30, 2021

(54) FASTENING BRACKET

(71) Applicant: Wistron NeWeb Corp., Hsinchu (TW)

(72) Inventors: Ping-You Weng, Hsinchu (TW); Yu-Shuo Wu, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 0 days.

(21) Appl. No.: 16/537,715

(22) Filed: Aug. 12, 2019

(65) Prior Publication Data
US 2020/0063909 A1 Feb. 27, 2020

(30) Foreign Application Priority Data
Aug. 24, 2018 (TW) .................................. 10712958.3

(51) Int. Cl.
| | |
|---|---|
| *F16M 11/04* | (2006.01) |
| *F16B 5/00* | (2006.01) |
| *F16B 5/10* | (2006.01) |
| *F16B 7/20* | (2006.01) |
| *F16M 13/02* | (2006.01) |
| *H04L 12/773* | (2013.01) |
| *H05K 5/02* | (2006.01) |

(52) U.S. Cl.
CPC .......... *F16M 11/041* (2013.01); *F16M 13/02* (2013.01); *F16B 5/0092* (2013.01); *F16B 5/10* (2013.01); *F16B 7/20* (2013.01); *H04L 45/60* (2013.01); *H05K 5/02* (2013.01)

(58) Field of Classification Search
USPC ........ 248/222.51, 222.52; 403/349, 345, 348
See application file for complete search history.

(56) References Cited

U.S. PATENT DOCUMENTS

| | | | | | |
|---|---|---|---|---|---|
| 4,532,672 A | * | 8/1985 | Anderson | ................ | E05F 5/06 16/86 A |
| 4,668,119 A | * | 5/1987 | Galletti | .................. | E02D 5/523 403/349 |
| 4,756,638 A | * | 7/1988 | Neyret | .................... | E05B 9/084 403/261 |

(Continued)

FOREIGN PATENT DOCUMENTS

| | | |
|---|---|---|
| CN | 106789690 A | 5/2017 |
| CN | 206365177 U | 7/2017 |

(Continued)

*Primary Examiner* — Alfred J Wujciak
(74) *Attorney, Agent, or Firm* — McClure, Qualey & Rodack, LLP

(57) ABSTRACT

A fastening bracket is provided. The fastening bracket is adapted to be affixed to a mounting surface and connected to an object. The fastening bracket includes a base and a connection unit. The base is for being affixed to the mounting surface. The connection unit is connected to the base, wherein the connection unit includes a unit inclined surface and at least one unit abutting portion. The object includes at least one object abutting portion. When the object is in a separated state, the object abutting portion is separated from the unit abutting portion, and when the object is in a connected state, the object abutting portion abuts the unit abutting portion. While the object is being moved from the separated state to the connected state, the object abuts the unit inclined surface and slides relative to the unit inclined surface.

18 Claims, 21 Drawing Sheets

(56) References Cited

U.S. PATENT DOCUMENTS

| | | | | |
|---|---|---|---|---|
| 5,133,617 A | * | 7/1992 | Sokn | F04D 29/626 |
| | | | | 403/343 |
| 5,732,836 A | * | 3/1998 | Barker | A61J 7/02 |
| | | | | 215/203 |
| 6,138,873 A | * | 10/2000 | Gramola | B65D 41/47 |
| | | | | 222/153.14 |
| 7,603,059 B2 | * | 10/2009 | Marumoto | G03G 15/757 |
| | | | | 192/56.61 |
| 2016/0082583 A1 | * | 3/2016 | Sergyeyenko | B25H 1/005 |
| | | | | 83/471 |
| 2016/0120267 A1 | * | 5/2016 | Burns | A44B 11/065 |
| | | | | 24/68 C |
| 2017/0057420 A1 | * | 3/2017 | Fiedler | F16M 13/00 |
| 2017/0184947 A1 | * | 6/2017 | Hyers | F16M 13/02 |
| 2017/0276290 A1 | * | 9/2017 | Fiedler | F16M 11/16 |

FOREIGN PATENT DOCUMENTS

| | | |
|---|---|---|
| CN | 207340086 U | 5/2018 |
| CN | 108194778 A | 6/2018 |

\* cited by examiner

FASTENING BRACKET

CROSS REFERENCE TO RELATED APPLICATIONS

This Application claims priority of Taiwan Patent Application No. 107129583, filed on Aug. 24, 2018, the entirety of which is incorporated by reference herein.

BACKGROUND OF THE INVENTION

Field of the Invention

The present invention relates to a fastening bracket, and in particular to a fastening bracket adapted to fasten an object on a mounting surface.

Description of the Related Art

Wireless routers are commonly fastened to a mounting surface with fastening brackets. Conventionally, a wireless router may be affixed to a fastening bracket with bolts. The wireless router is heavy, and huge amount of bolts are required to fasten one single wireless router. Several of the bolts fasten the wireless router to the fastening bracket in different directions. Therefore, the process for fastening the wireless router to the fastening bracket cannot be accomplished by one single user. The fastening process is dangerous, and requires time and effort.

BRIEF SUMMARY OF THE INVENTION

In one embodiment, a fastening bracket is provided. The fastening bracket is adapted to be affixed to a mounting surface and connected to an object. The fastening bracket includes a base and a connection unit. The base is for being affixed to the mounting surface. The connection unit is connected to the base, wherein the connection unit comprises a unit inclined surface and at least one unit abutting portion. The object comprises at least one object abutting portion. When the object is in a separated state, the object abutting portion is separated from the unit abutting portion, and when the object is in a connected state, the object abutting portion abuts the unit abutting portion. While the object is being moved from the separated state to the connected state, the object abuts the unit inclined surface and slides relative to the unit inclined surface.

In one embodiment, the object is rotatable about an axis between a first object orientation and a second object orientation relative to the connection unit, when the object is in the first object orientation, the object abutting portion is separated from the unit abutting portion, and when the object is in the second object orientation, the object abutting portion abuts the unit abutting portion to restrict the movement of the object along the axis and relative to the fastening bracket, and during the object's rotation from the first object orientation to the second object orientation, the object abuts the unit inclined surface and slides relative to the unit inclined surface.

In one embodiment, the connection unit comprises a first disc and a second disc, the first disc is connected to the base, the first disc is parallel to the second disc, the unit inclined surface is formed on the first disc and faces the second disc, the unit abutting portion is formed on the second disc and faces the first disc, the second disc comprises at least one disc truncated portion, and when the object is in the first object orientation, the object abutting portion corresponds to the disc truncated portion.

In one embodiment, the connection unit comprises a bracket unit, a rotor and a compression spring, the bracket unit is connected with the base, the rotor is rotatably disposed in the bracket unit, one end of the compression spring abuts the base, the other end of the compression spring abuts the rotor, and the unit inclined surface and the unit abutting portion are located on the rotor.

In one embodiment, the connection unit comprises a bracket unit, a torsion spring and a stopper, the bracket unit is connected to the base, the stopper pivots on the bracket unit, the stopper comprises a first stopper surface and a second stopper surface, the first stopper surface is opposite to the second stopper surface, the unit inclined surface is formed on the first stopper surface, the unit abutting portion is formed on the second stopper surface, one end of the torsion spring abuts the bracket unit, and the other end of the torsion spring abuts the stopper.

Utilizing the fastening bracket of the embodiments of the invention, the object (for example, wireless router or other electronic device) can be easily fastened to the mounting surface (for example, ceiling). The user only needs to push the object upward (or, with slight rotation) to complete the connection between the object (for example, wireless router) and the fastening bracket. The stability and safety of the connection between the object and the fastening bracket are improved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
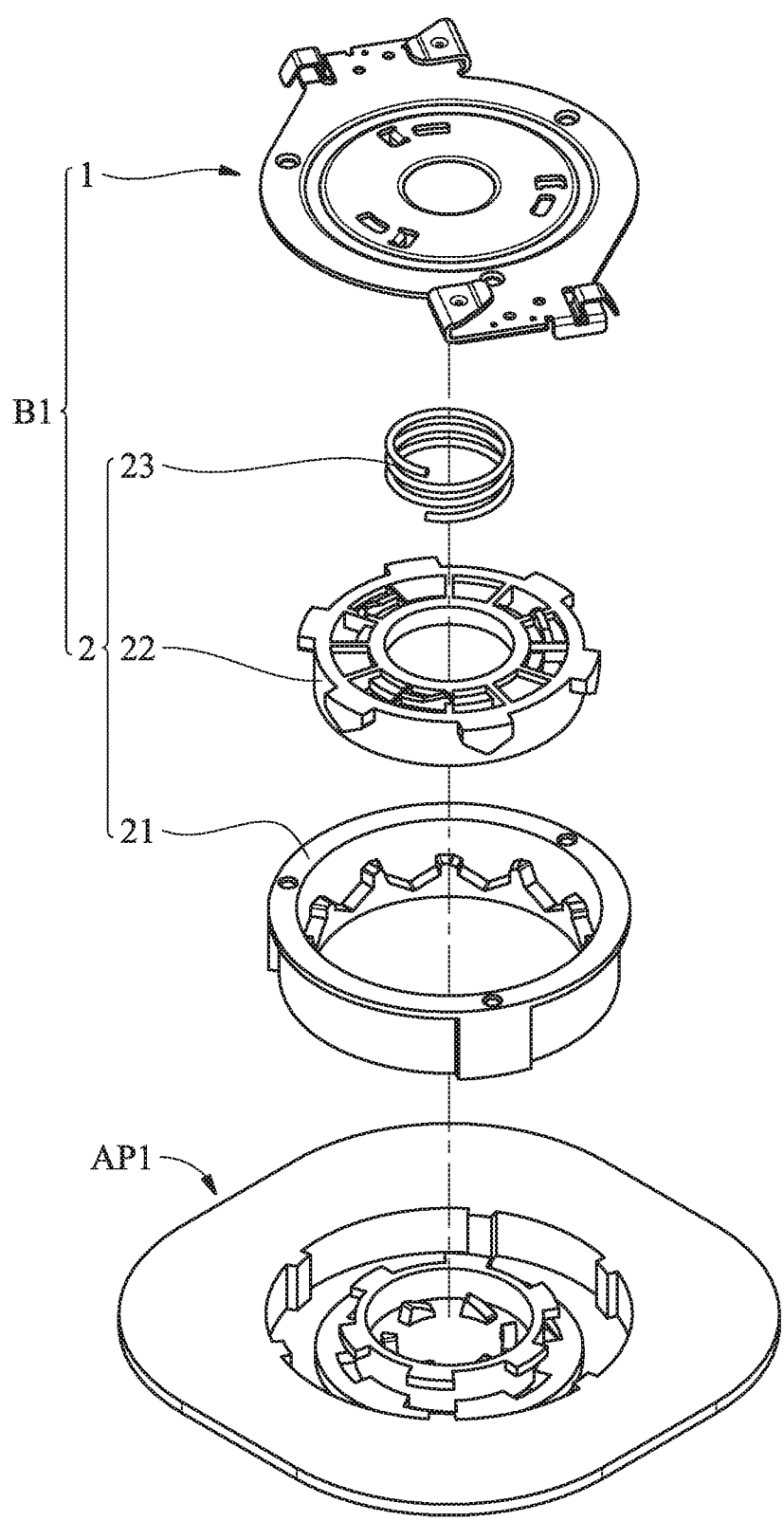
FIG. 1 is an exploded view of a fastening bracket of a first embodiment of the invention.

FIG. 1 is an exploded view of a fastening bracket B1 of a first embodiment of the invention. With reference to FIG. 1, the fastening bracket B1 is adapted to be affixed to a mounting surface (for example, ceiling, not shown), and connected to an object AP1 (for example, wireless router or other electronic device). The fastening bracket B1 includes a base 1 and a connection unit 2. The base 1 is adapted to be affixed to the mounting surface. The connection unit 2 is connected to the base 1.

With reference to FIG. 1, in one embodiment, the connection unit 2 comprises a bracket unit 21, a rotor 22 and a compression spring 23. The bracket unit 21 is connected with the base 1. The rotor 22 is rotatably disposed in the bracket unit 21. One end of the compression spring 23 abuts the base 1, and the other end of the compression spring 23 abuts the rotor 22. The compression spring 23 provide a recovery force.

Figure 2A:
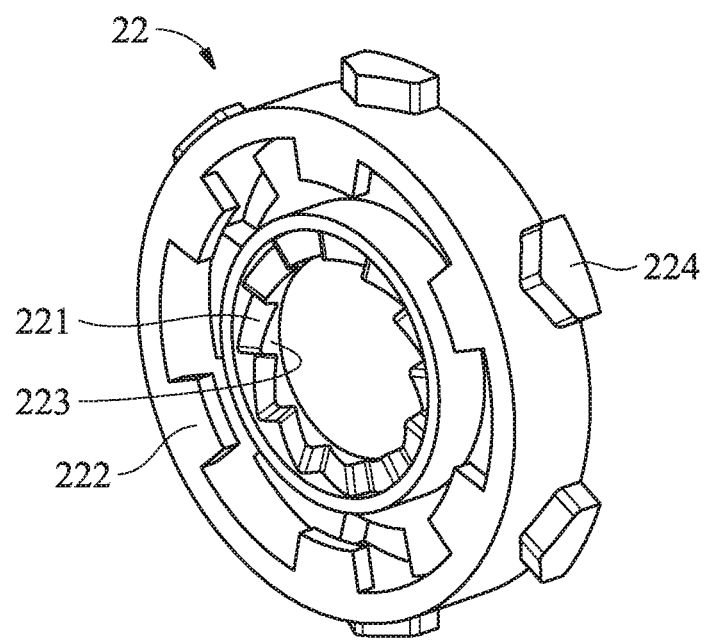
FIG. 2A shows the details of a rotor of the first embodiment of the invention.
Figure 2B:
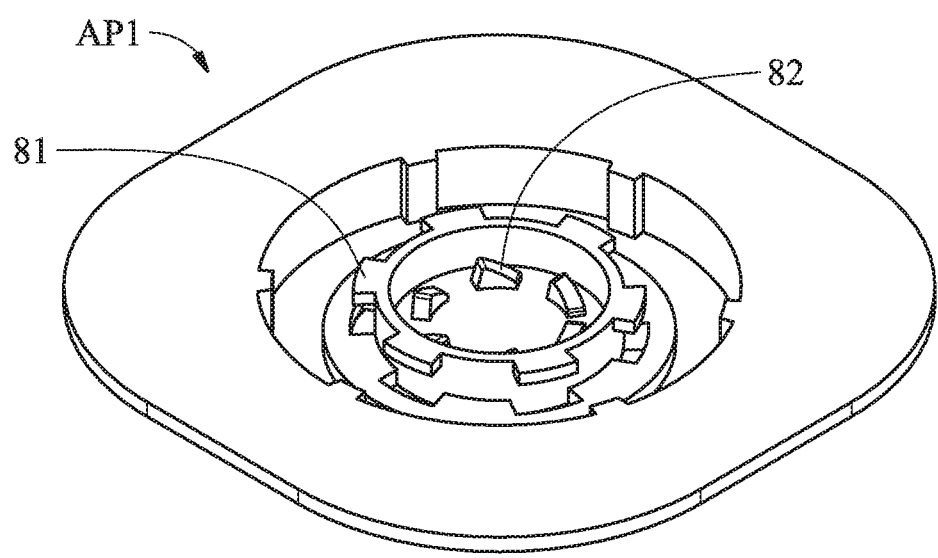
FIG. 2B shows the details of an object of the first embodiment of the invention.
Figure 2C:
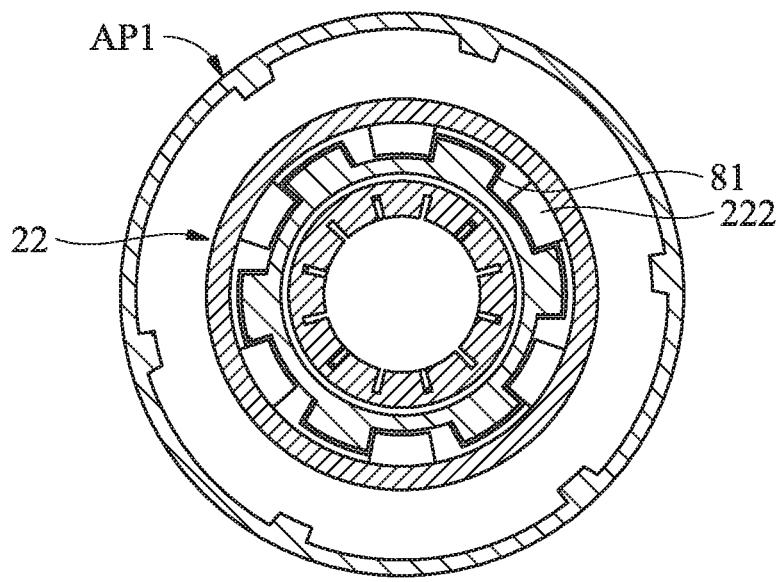
FIG. 2C shows a portion of the fastening bracket of the first embodiment of the invention, wherein the object is in a separated state.
Figure 2D:
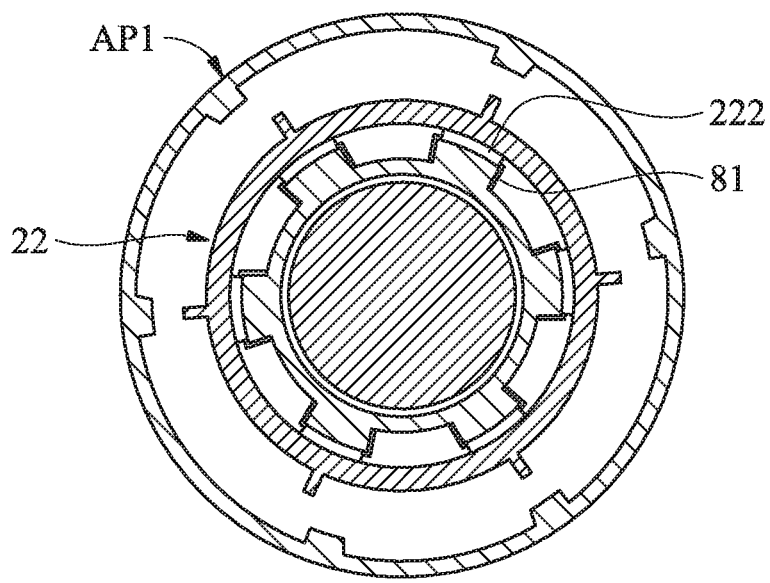
FIG. 2D shows a portion of the fastening bracket of the first embodiment of the invention, wherein the object is in a connected state.
Figure 2E:
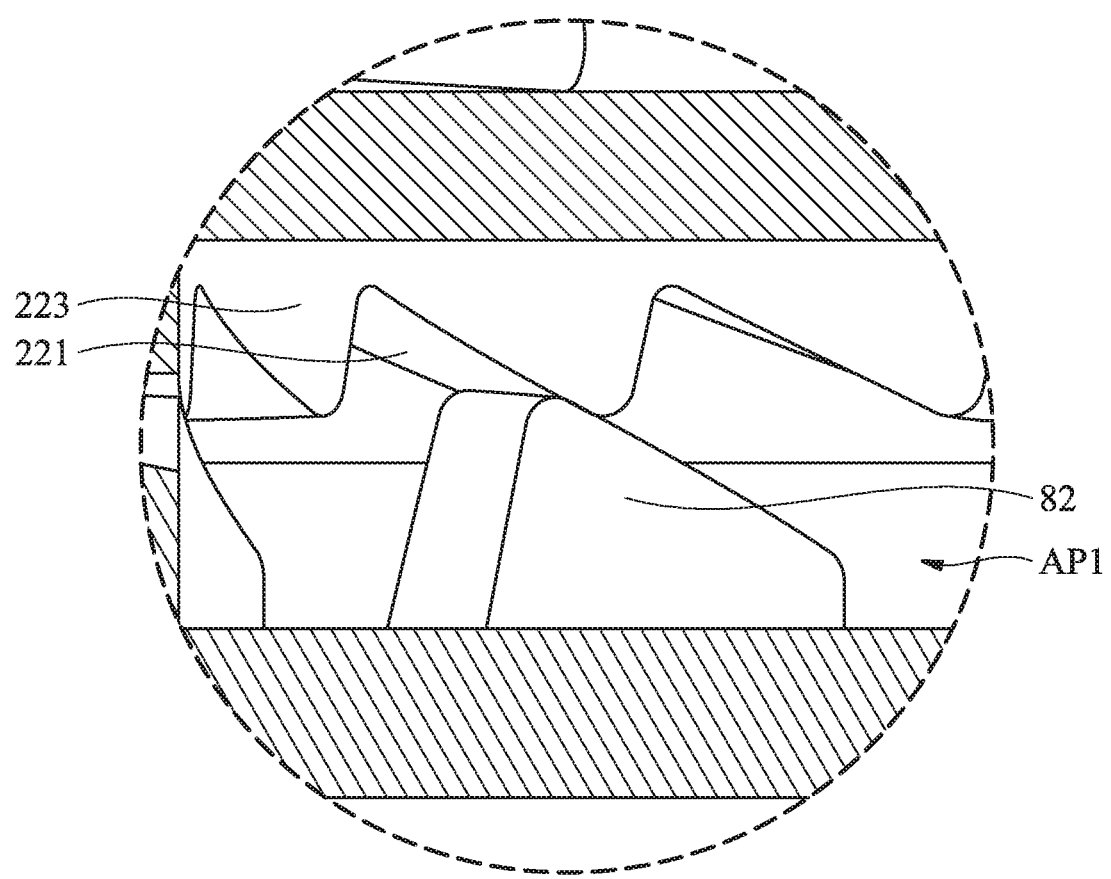
FIG. 2E shows the object abutting the unit inclined surface and sliding on the unit inclined surface of the first embodiment of the invention.
Figure 3A:
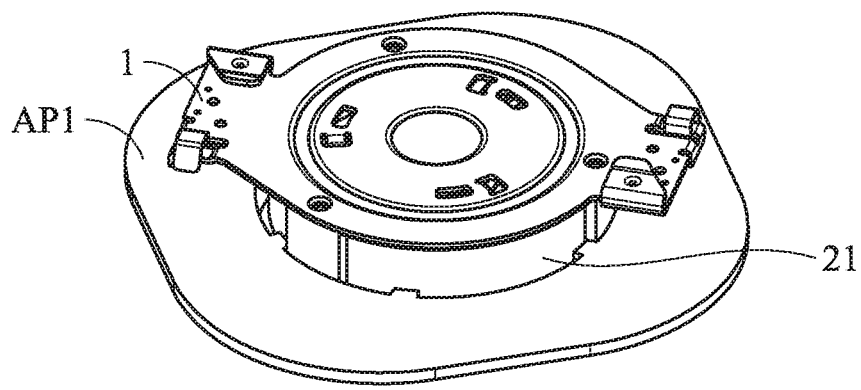
FIGS. 3A, 3B and 3C show the process for affixing the object to the fastening bracket of the first embodiment of the invention.
Figure 3B:
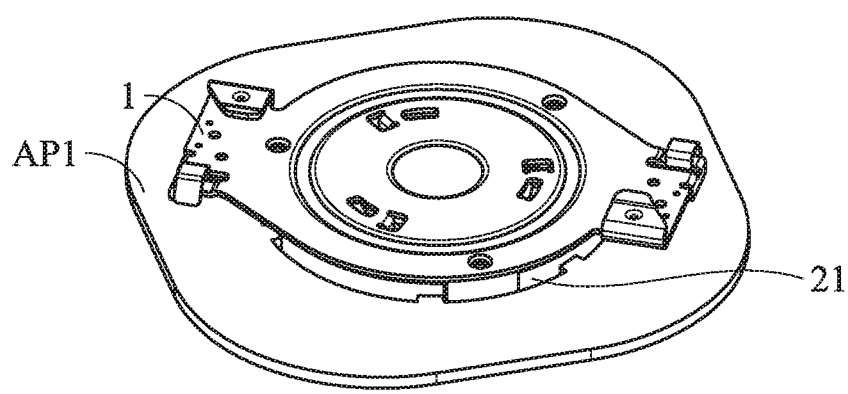
Figure 3C:
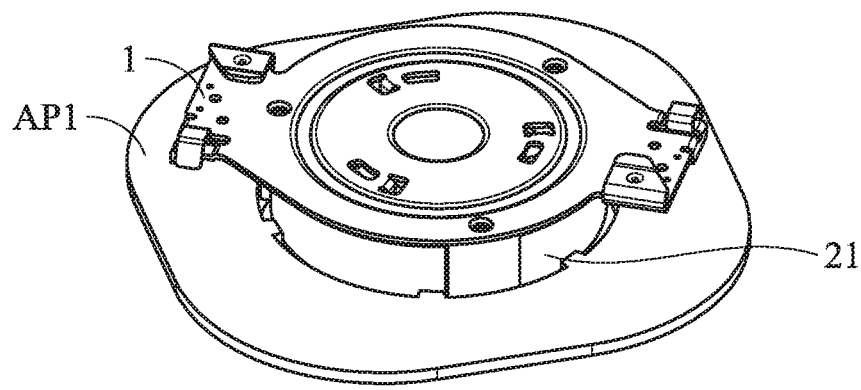

FIG. 2A shows the details of the rotor 22 of the first embodiment of the invention. With reference to FIG. 2A, the connection unit 2 comprises a unit inclined surface 221 and at least one unit abutting portion 222. The unit inclined surface 221 and the unit abutting portion 222 are disposed on the rotor 22. FIG. 2B shows the details of the object AP1 of the first embodiment of the invention. With reference to FIG. 2B, the object comprises at least one object abutting portion 81. With reference to FIGS. 2C and 2D, when the object AP1 is in a separated state (FIG. 2C), the object abutting portion 81 is separated from the unit abutting portion 222. When the object AP1 is in a connected state (FIG. 2D), the object abutting portion 81 is at least partially overlapping thereby abutting the unit abutting portion 222. With reference to FIG. 2E, While the object AP1 is being moved from the separated state to the connected state, the object AP1 abuts the unit inclined surface 221 and slides relative to the unit inclined surface 221.

With reference to FIGS. 2C and 2D, in this embodiment, by rotating the rotor 22, the object AP1 can be switched between the separated state and the connected state. The rotor 22 capable of being rotated between a first rotor state (FIG. 2C, separated state) and a second rotor state (FIG. 2D, connected state). When the rotor 22 is in the first rotor state, the object abutting portion 81 is separated from the unit abutting portion 222. When the rotor 22 is in the second rotor state, the object abutting portion 81 abuts the unit abutting portion 222.

With reference to FIGS. 2B and 2E, in one embodiment, the object AP1 comprises a plurality of object inclined structures 82. The rotor 22 comprises a plurality of rotor inclined structures 223. The unit inclined surface 221 is formed on at least one of the rotor inclined structures 223. With reference to FIGS. 2E and 3A-3C, while the object AP1 is being moved upward from the first object position (FIG. 3A, separated state) to the second object position (FIG. 3B), the object inclined structures 82 contacts the rotor inclined structures 223 and moves the rotor 22, thereby switching the rotor 22 from the first rotor state to the second rotor state (by rotating the rotor for a distance of one rotor inclined structure 223). As a result, the object AP1 is connected to the rotor 22 while the object AP1 moves back to the first object position (FIG. 3C, connected state) upon release of the object AP1 by the user.

According to the design of the first embodiment of the invention, the object AP1 can be easily hung on the mounting surface via the fastening bracket B1.

Figure 4A:
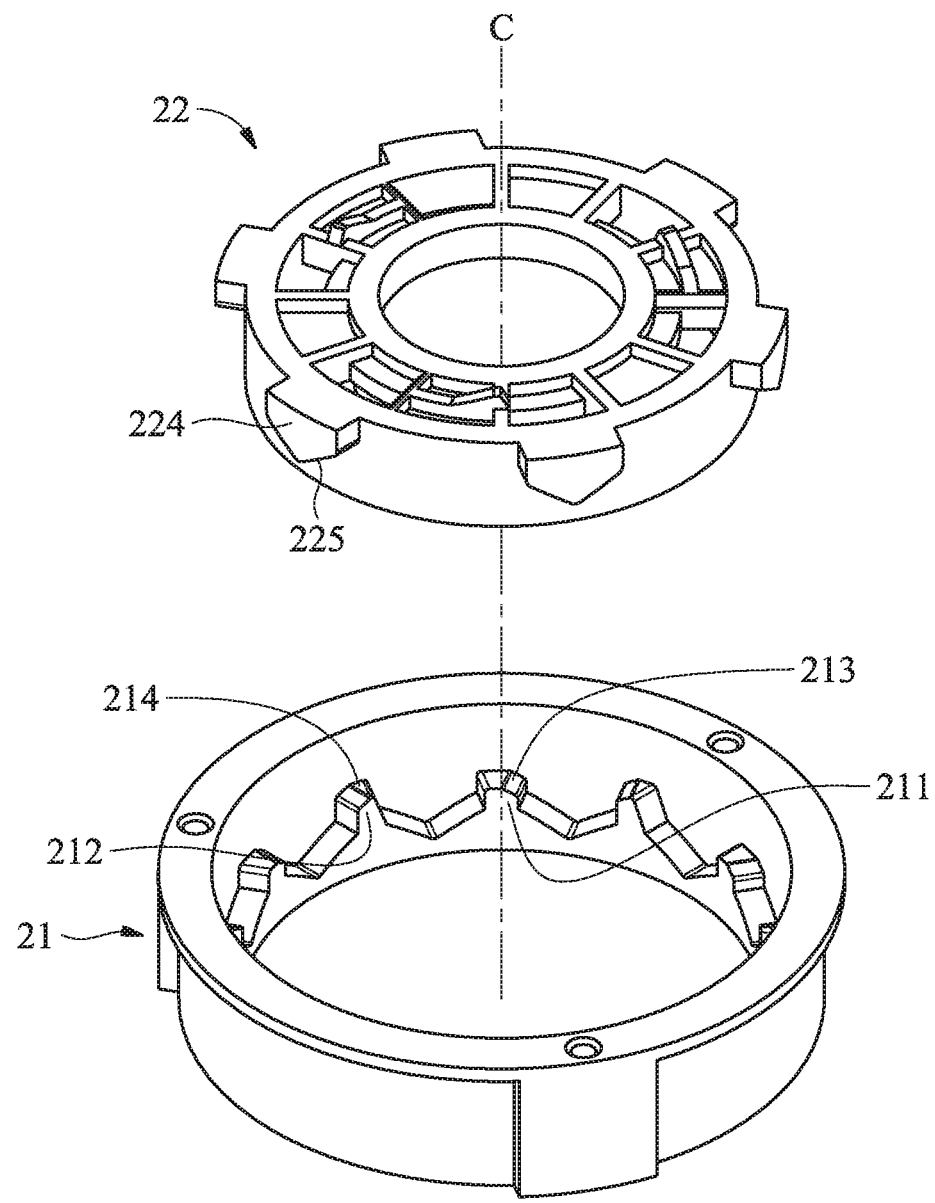
FIG. 4A shows the details of the rotor and the bracket unit of the first embodiment of the invention.
Figure 4B:
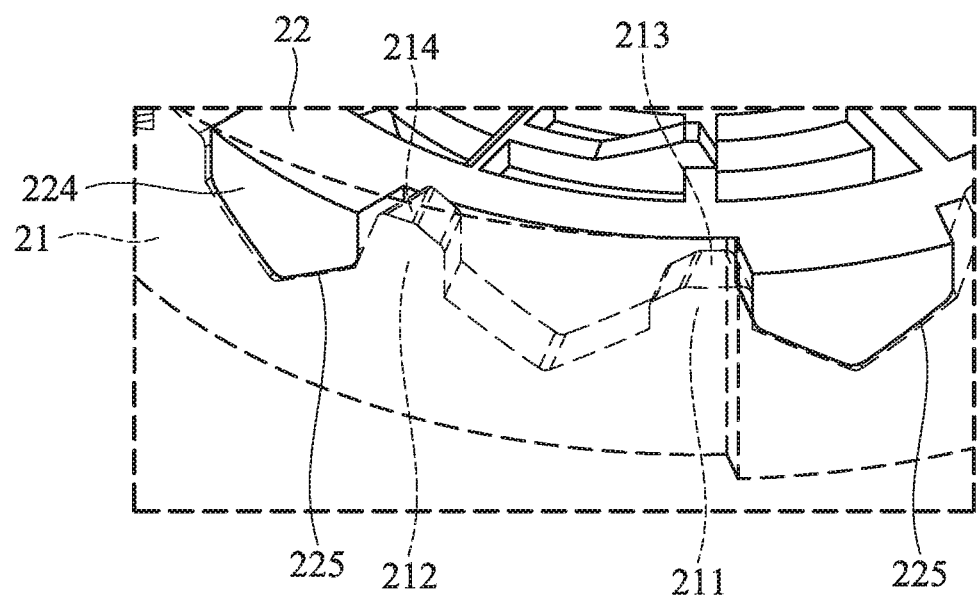
FIG. 4B shows a wedging protrusion of the first embodiment of the invention being wedged between the first wall and the second wall.

With reference to FIG. 4A, in one embodiment, the rotor 22 further comprises a plurality of wedging protrusions 224 arranged around an axis C. The wedging protrusions 224 are formed on an outer surface of the rotor 22. The bracket unit 21 comprises a plurality of first walls 211 and a plurality of second walls 212. The first walls 211 and the second walls 212 are alternately arranged along an inner surface of the rotor 22. To switch the rotor 22 from the first rotor state to the second rotor state, the wedging protrusions 224 are moved to pass over the first walls 211. To switch the rotor 22 from the second rotor state back to the first rotor state, the wedging protrusions 224 are moved to pass over the second walls 212. In this embodiment of the invention, the wedging protrusions 224 being located between the first wall 211 (see FIG. 4B) and the second wall 212 can prevent the rotor 22 from being moved relative to the bracket unit 21 upon unexpected strikes.

With reference to FIGS. 3A-3C, 4A and 4B, in one embodiment, the height of the first walls 211 is lower than the height of the second walls 212. While the object AP1 is being moved from the first object position (FIG. 3A) to the second object position (FIG. 3B), the rotor 22 is moved from a first rotor height to a second rotor height. When the rotor 22 is at the second rotor height, the wedging protrusions 224 are higher than the first walls 211. Therefore, the rotor 22 can be easily rotated while the wedging protrusions 224 cross over the first walls 211, and the object AP1 can be wedged to the rotor 22.

Figure 5A:
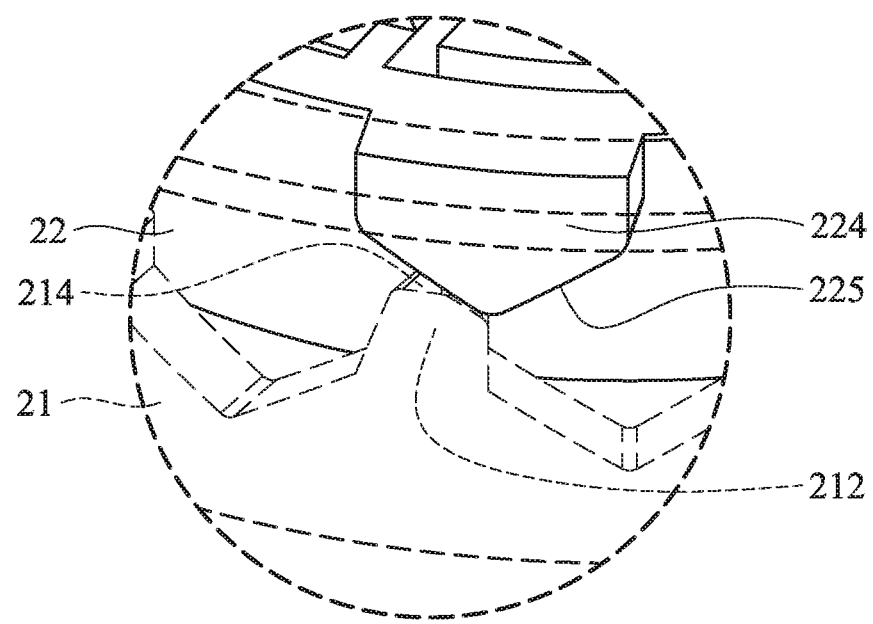
FIGS. 5A and 5B show the wedging protrusion of the first embodiment of the invention passing over the second wall.
Figure 5B:
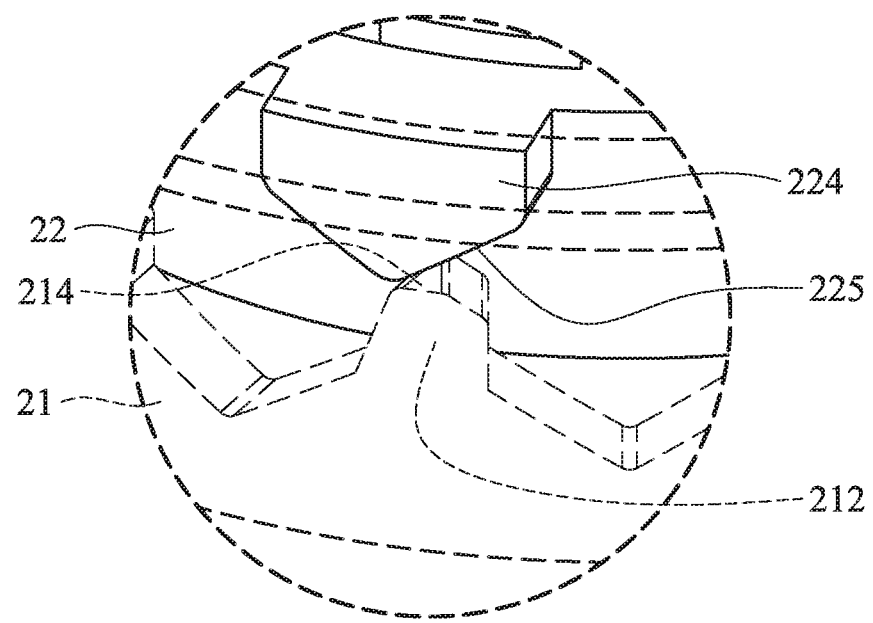
Figure 6A:
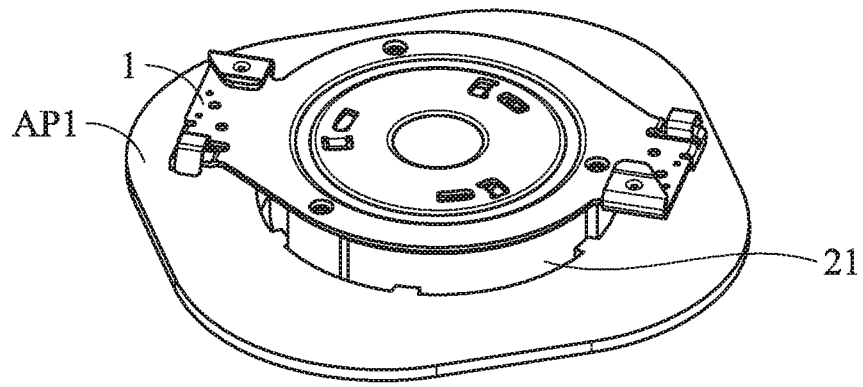
FIGS. 6A, 6B and 6C show the object being released from the bracket unit of the first embodiment of the invention.
Figure 6B:
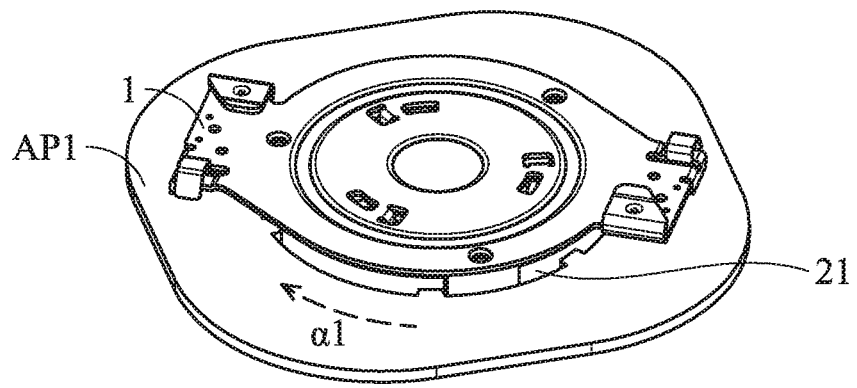
Figure 6C:
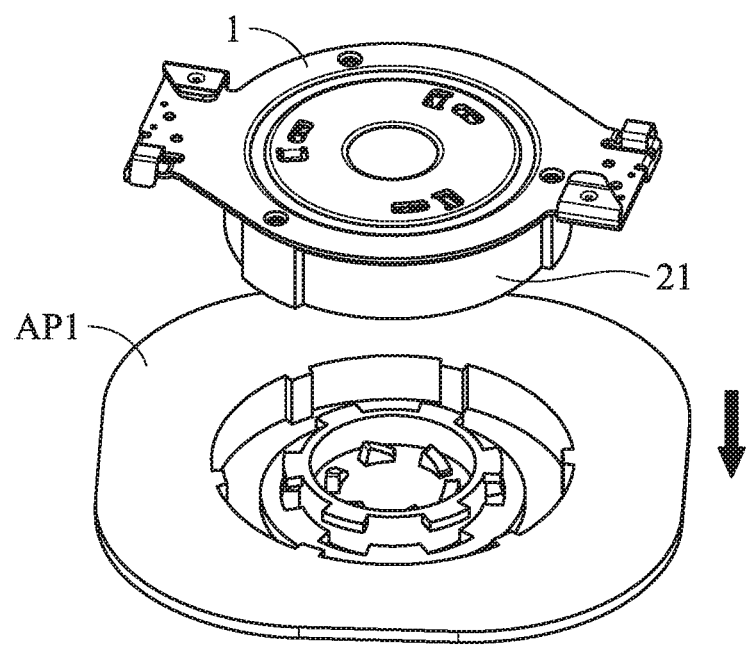

The process for releasing the object AP1 from the fastening bracket B1 is described in this paragraph. FIGS. 6A, 6B and 6C show a process of the object AP1 being released from the bracket unit of the first embodiment of the invention. With reference to FIGS. 6A, 6B and 6C, when the user intends to release the object AP1 from the fastening bracket B1, firstly, the object AP1 is moved upward from the first object position (FIG. 6A) to the second object position (FIG. 6B). Next, with reference to FIGS. 5A and 5B, by rotating the object AP1 (FIG. 6B), the object inclined structures 82 further pushes the rotor inclined structures 223 and moves the rotor 22 from the second rotor height (FIG. 5A) to a third rotor height (FIG. 5B) along the second wall 212. When the rotor 22 is at the third rotor height (FIG. 5B), the wedging protrusions 224 are slightly higher than the second wall 212, so that the wedging protrusions 224 may pass over the second wall 212. Therefore, the rotor 22 is switched from the second rotor state to the first rotor state, and the object AP1 is adapted to be separated from the fastening bracket B1 (FIG. 6C). Utilizing the wedging protrusions 224, the first walls 211 and the second walls 212 of the first embodiment of the invention, the object AP1 is prevented from being separated from the fastening bracket B1 under simple up and down movement, and the safety of the fastening bracket B1 is improved.

With reference to FIG. 4A, in one embodiment, each first wall 211 comprises a first wall guiding surface 213. Each second wall 212 comprises a second wall guiding surface 214. Each wedging protrusion 224 comprises a protrusion guiding surface 225. When the wedging protrusion 224 passes over the first wall 211, the protrusion guiding surface 225 abuts and slides along the first wall guiding surface 213. When the wedging protrusion 224 passes over the second wall 212, the protrusion guiding surface 225 abuts and slides along the second wall guiding surface 214 by applying external rotational force on the object AP1, moving the rotor 22 from the second rotor height (FIG. 5A) to a third rotor height (FIG. 5B) as depicted above. The first wall guiding surface 213 and the second wall guiding surface 214 guide the wedging protrusion 224 to smoothly fall between the first wall 211 and the second wall 212.

Figure 7:
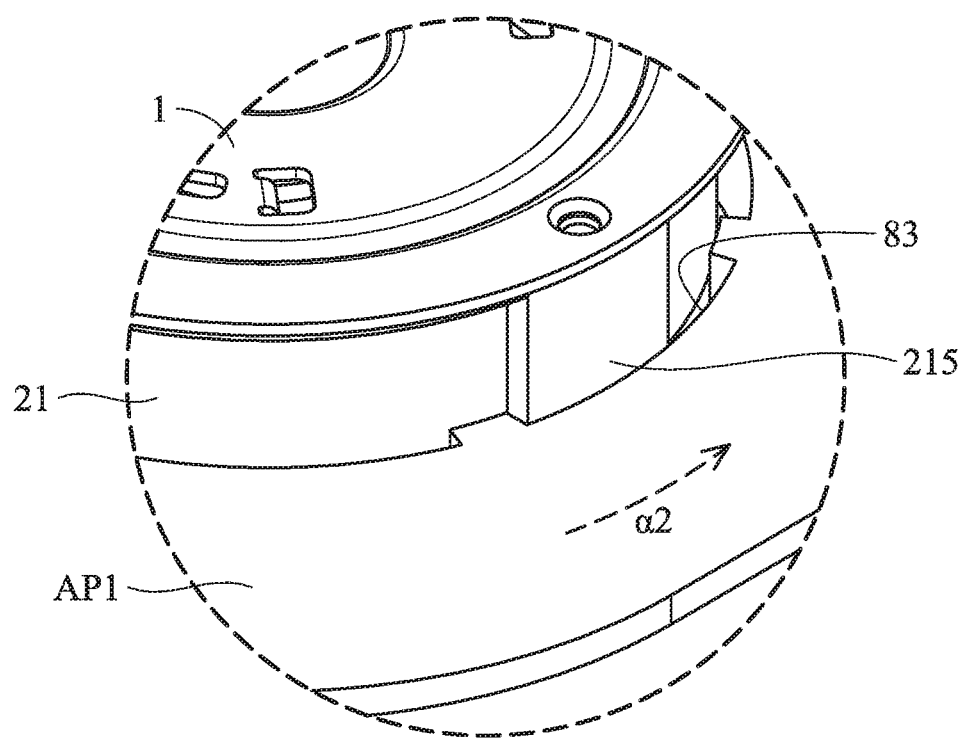
FIG. 7 shows an object restriction slot and a bracket restricting protrusion of the first embodiment of the invention.

With reference to FIG. 7, in one embodiment, the object AP1 comprises at least one object restriction slot 83. The bracket unit 21 comprises at least one bracket restricting protrusion 215. The bracket restricting protrusion 215 is located in the object restriction slot 83. With reference to FIGS. 6B and 7, when the object AP1 is in the second object position, the bracket restricting protrusion 215 is allowed to be moved along the object restriction slot 83. By further rotating the object AP1 toward a first object rotational direction α1, the rotor 22 is moved from the second rotor height to the third rotor height. When the object AP1 is rotated in a second object rotational direction α2, a side of the object restriction slot 83 abuts the bracket restricting protrusion 215 to prevent the object AP1 from being rotated in the second object rotational direction α2. The first object rotational direction α1 is opposite to the second object rotational direction α2.

Figure 8A:
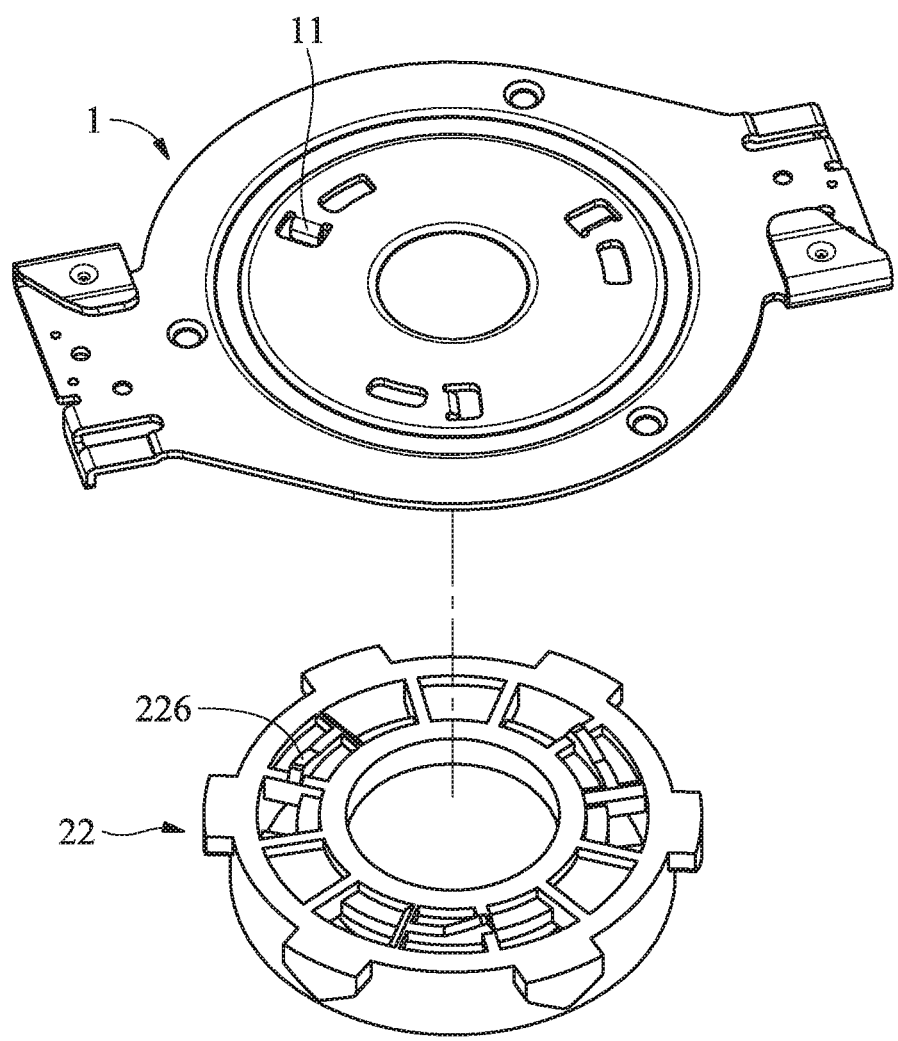
FIGS. 8A and 8B show a base restriction portion and a rotor restriction portion of the first embodiment of the invention.
Figure 8B:
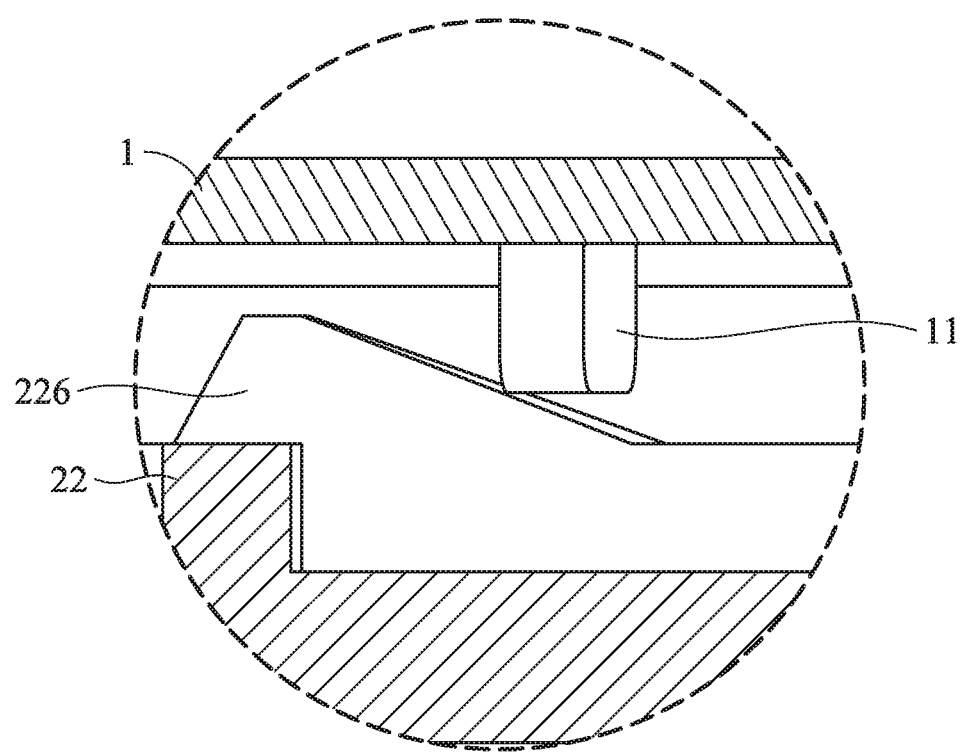

With reference to FIGS. 8A and 8B, in one embodiment, the base 1 comprises a base restriction portion 11. The rotor 22 comprises a rotor restriction portion 226. When the base 1 is assembled with the connection unit 2, the rotor restriction portion 226 abuts the base restriction portion 11 to prevent the rotor 22 from being rotated relative to the bracket unit 21 during assembling process.

Figure 9A:
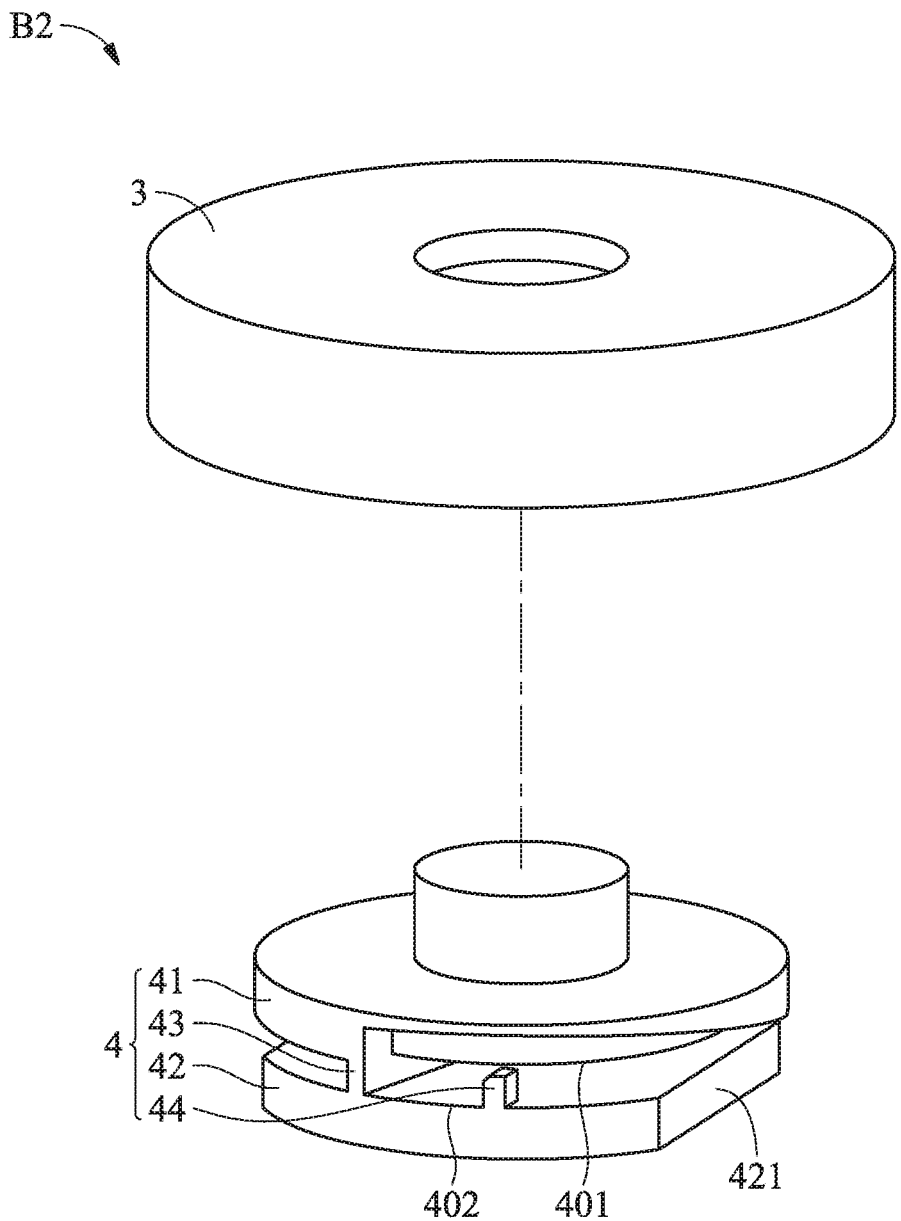
FIG. 9A is an exploded view a fastening bracket of a second embodiment of the invention.
Figure 9B:
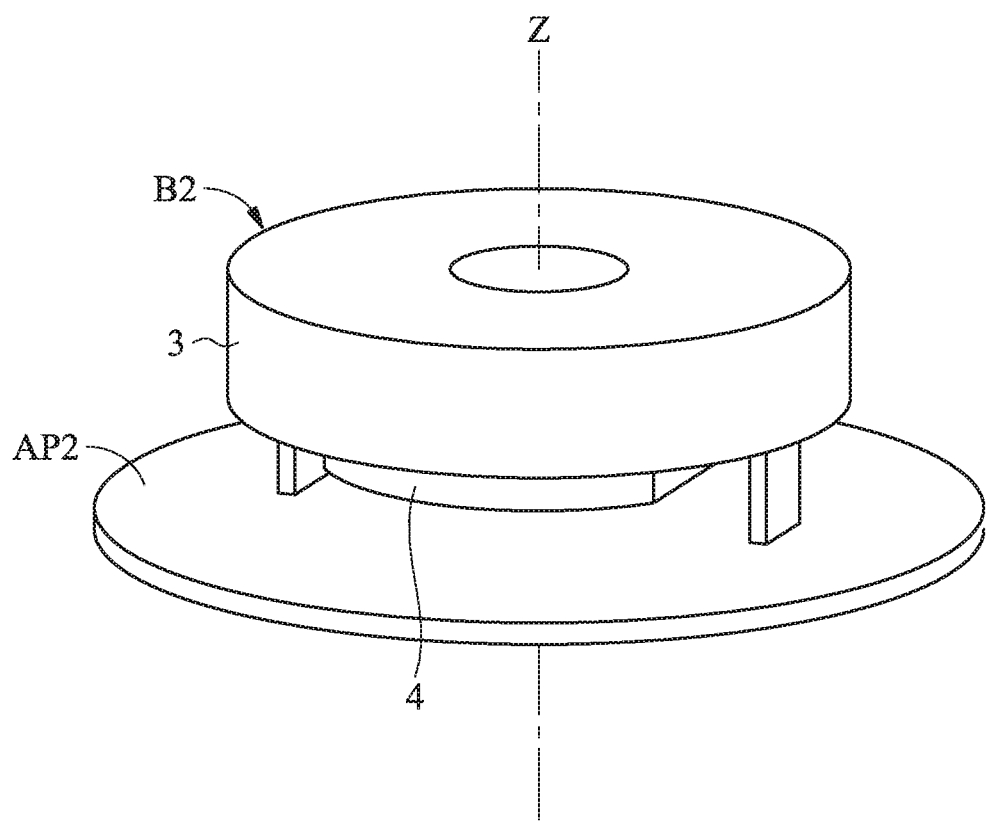
FIG. 9B is an assembled view the fastening bracket of the second embodiment of the invention.
Figure 10A:
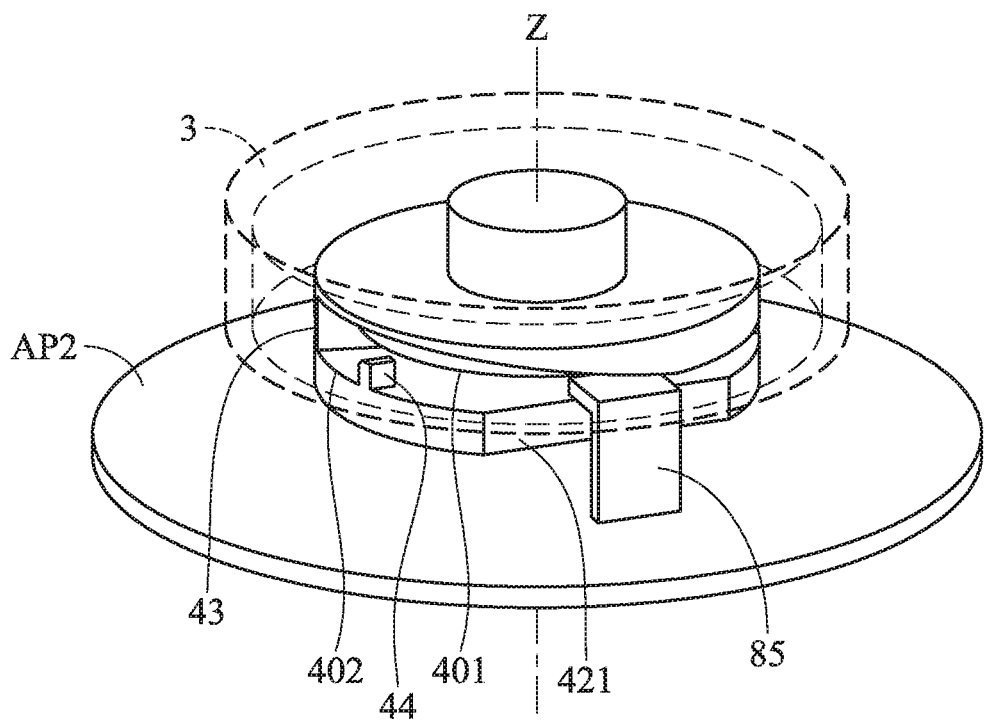
FIG. 10A shows the fastening bracket of the second embodiment of the invention, wherein an object is in a first object orientation.
Figure 10B:
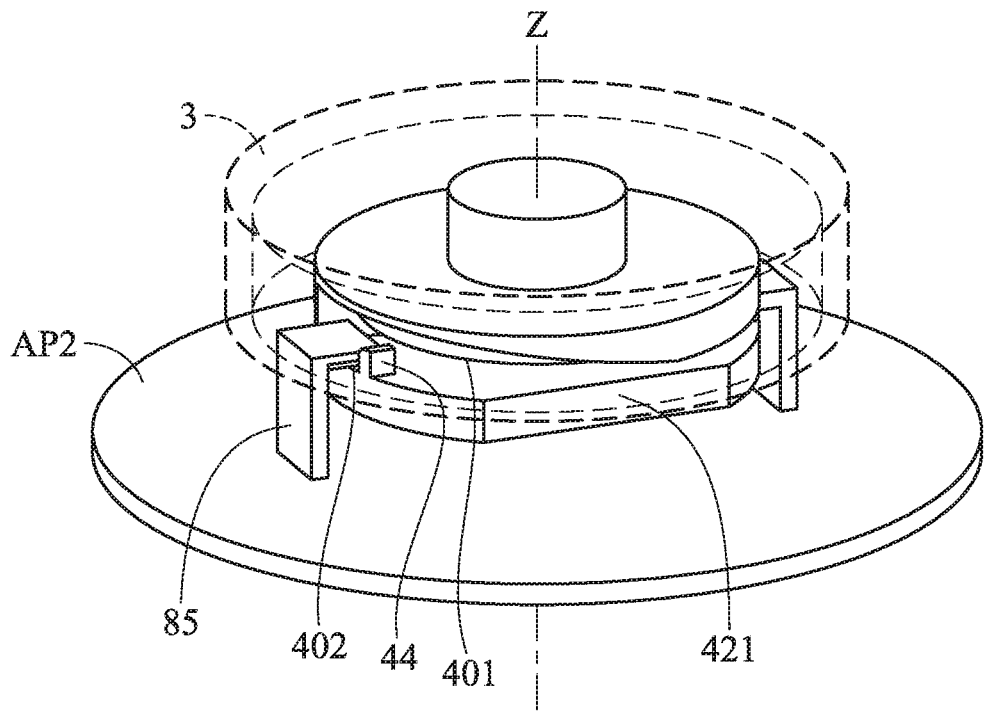
FIG. 10B shows the fastening bracket of the second embodiment of the invention, wherein the object is in a second object orientation.

FIG. 9A is an exploded view a fastening bracket B2 of a second embodiment of the invention. FIG. 9B is an assembled view the fastening bracket B2 of the second embodiment of the invention. With reference to FIGS. 9A and 9B, in this embodiment, the fastening bracket B2 includes a base 3 and a connection unit 4. The base 3 is adapted to be affixed to the mounting surface. With reference to FIGS. 10A and 10B, the object AP2 is rotated around an axis Z between a first object orientation (FIG. 10A) and a second object orientation (FIG. 10B) relative to the connection unit 4. With reference to FIG. 10A, when the object AP2 is in the first object orientation, the object abutting portion 85 is separated from the unit abutting portion 402. With reference to FIG. 10B when the object AP2 is in the second object orientation, the object abutting portion 85 abuts the unit abutting portion 402 to restrict the movement of the object AP2 on the axis Z relative to the fastening bracket B2. While the object AP2 is rotating from the first object orientation to the second object orientation, the object AP2 abuts the unit inclined surface 401 and slides on the unit inclined surface 401.

With reference to FIG. 9A, in one embodiment, the connection unit 4 comprises a first disc 41 and a second disc 42. The first disc 41 is connected to the base 3. The first disc 41 is parallel to the second disc 42. The unit inclined surface 401 is formed on the first disc 41 and faces the second disc 42. The unit abutting portion 402 is formed on the second disc 42 and faces the first disc 41. The second disc 42 comprises at least one disc truncated portion 421. When the object AP2 is in the first object orientation, the object abutting portion 85 corresponds to the disc truncated portion 421 (with reference to FIG. 10A).

With reference to FIGS. 10A and 10B, in one embodiment, the object abutting portion 85 comprises a cantilever beam. While the object AP2 is being rotated from the first object orientation to the second object orientation, the object abutting portion 85 abuts the unit inclined surface 401 and slides on the unit inclined surface 401.

With reference to FIGS. 10A and 10B, in one embodiment, the connection unit 4 further comprises a wall 43 and a block 44. The wall 43 connects the first disc 41 to the second disc 42. The block 44 is disposed on the second disc 42 and protrudes toward the first disc 41. When the object AP2 is in the second object orientation, the object abutting portion 85 abuts the unit abutting portion 402, and the object abutting portion 85 is restricted between the wall 43 and the block 44.

Figure 11A:
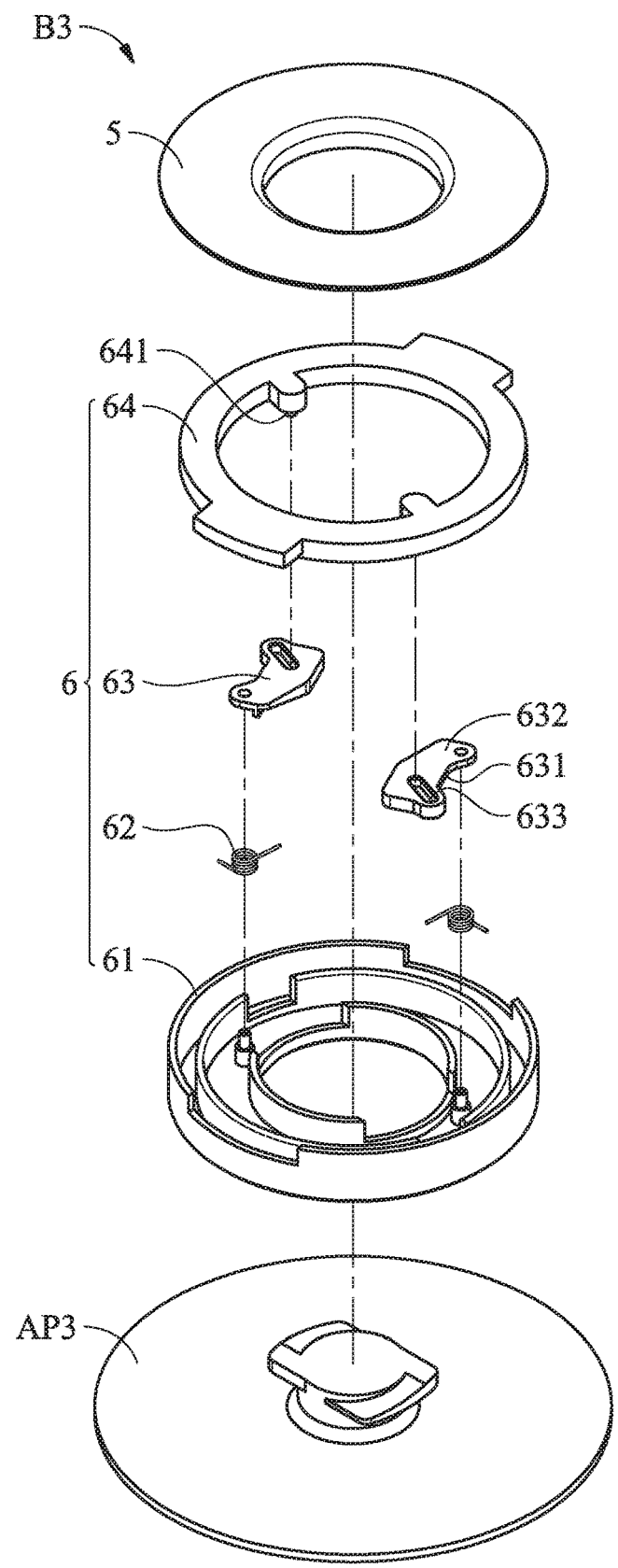
FIG. 11A is an exploded view a fastening bracket of a third embodiment of the invention.
Figure 11B:
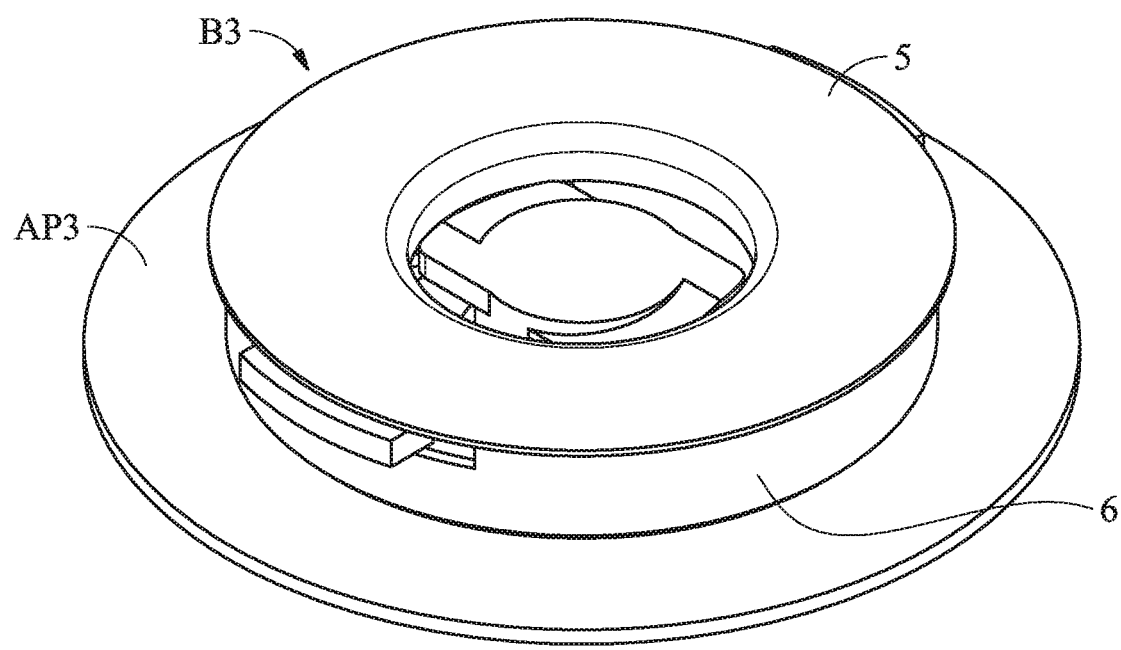
FIG. 11B is an assembled view the fastening bracket of the third embodiment of the invention.
Figure 12:
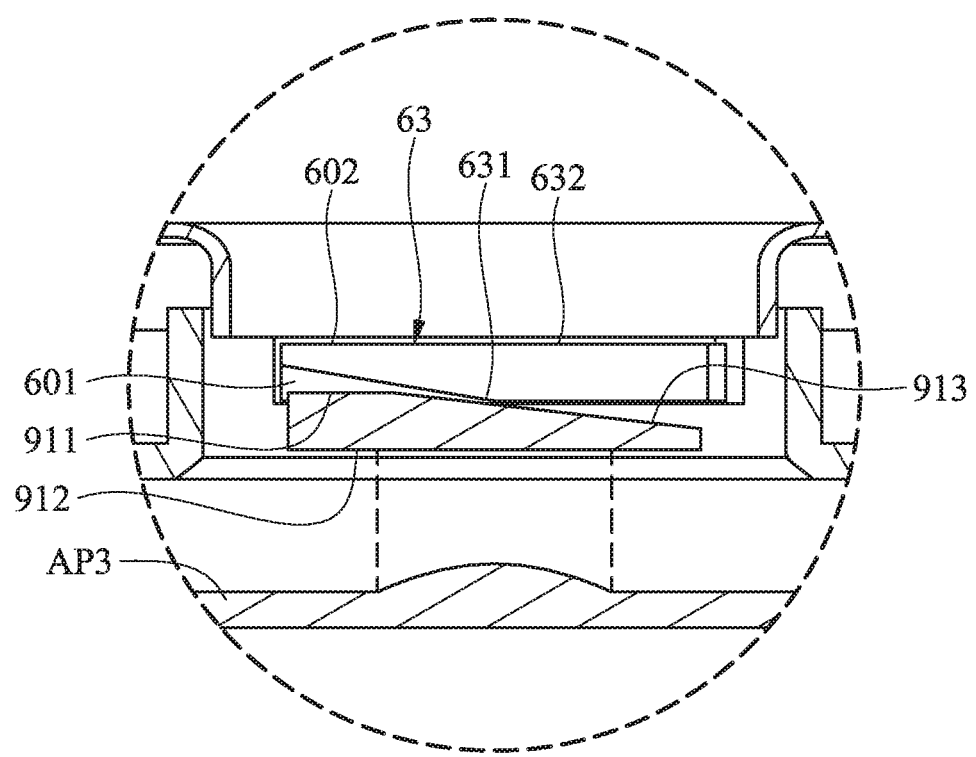
FIG. 12 shows the details of a stopper of the third embodiment of the invention.

FIGS. 11A and 11B show a fastening bracket B3 of a third embodiment of the invention. With reference to FIGS. 11A and 11B, the fastening bracket B3 is affixed to a mounting surface (not shown) and is connected to an object AP3. The fastening bracket B3 includes a base 5 and a connection unit 6. The base 5 is adapted to be affixed to the mounting surface. The connection unit 6 is connected to the base 5. The connection unit 6 comprises a bracket unit 61, a torsion spring 62 and a stopper 63. The bracket unit 61 is connected to the base 5. The stopper 63 pivots on the bracket unit 61. The stopper 63 comprises a first stopper surface 631 and a second stopper surface 632. With reference to FIG. 12, the first stopper surface 631 is opposite to the second stopper surface 632. The unit inclined surface 601 is formed on the first stopper surface 631. The unit abutting portion 602 is formed on the second stopper surface 632. One end of the torsion spring 62 abuts the bracket unit 61, and the other end of the torsion spring 62 abuts the stopper 63.

Figure 13A:
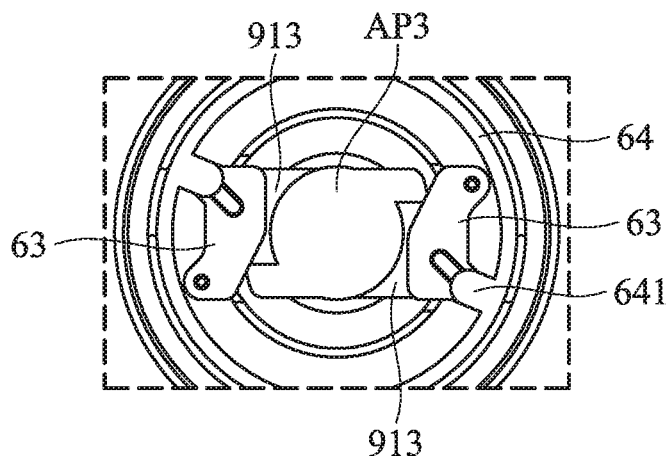
FIGS. 13A, 13B and 13C show the process for affixing the object to the fastening bracket of the third embodiment of the invention.
Figure 13B:
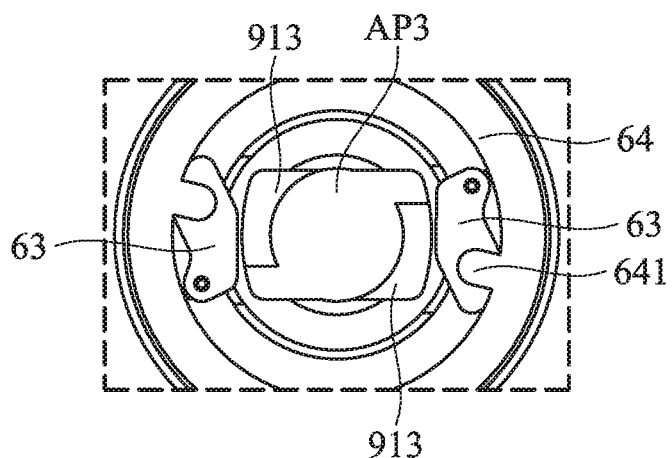
Figure 13C:
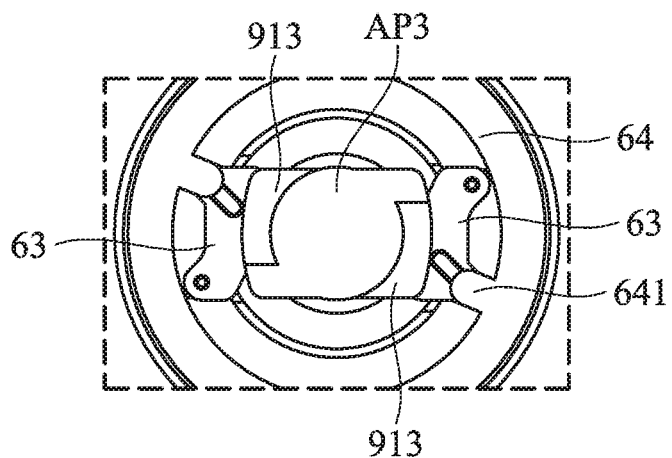

With reference to FIGS. 11A, 12, 13A, 13B and 13C, in one embodiment, the object AP3 comprises an object plate 91, and the object plate 91 comprises a first plate surface 911 and a second plate surface 912. The first plate surface 911 is opposite to the second plate surface 912. An object inclined surface 913 is formed on the first plate surface 911. While the object AP3 is being moved from a first object position (FIG. 13A) to a second object position (FIG. 13C), the object inclined surface 913 abuts the unit inclined surface 601 and rotates the stopper 63 (FIG. 13B). Therefore, the object AP3 can smoothly reach the second object position (FIG. 13C).

With reference to FIGS. 13A, 13B and 13C, in one embodiment, the stopper 63 is rotated between a first stopper orientation and a second stopper orientation. While the object AP3 is being moved from the first object position (FIG. 13A, separated state) to the second object position (FIG. 13C, connected state), the stopper 63 is pushed from the first stopper orientation (FIG. 13A) to the second stopper orientation (FIG. 13B) by the object AP3. The torsion spring 63 provides an elastic force for moving the stopper 63 from the second stopper orientation (FIG. 13B) to the first stopper orientation (FIG. 13C). When the object AP3 is in the second object position ((FIG. 13C, connected state), the unit abutting portion 602 of the stopper 63 abuts the second plate surface 912.

Figure 14A:
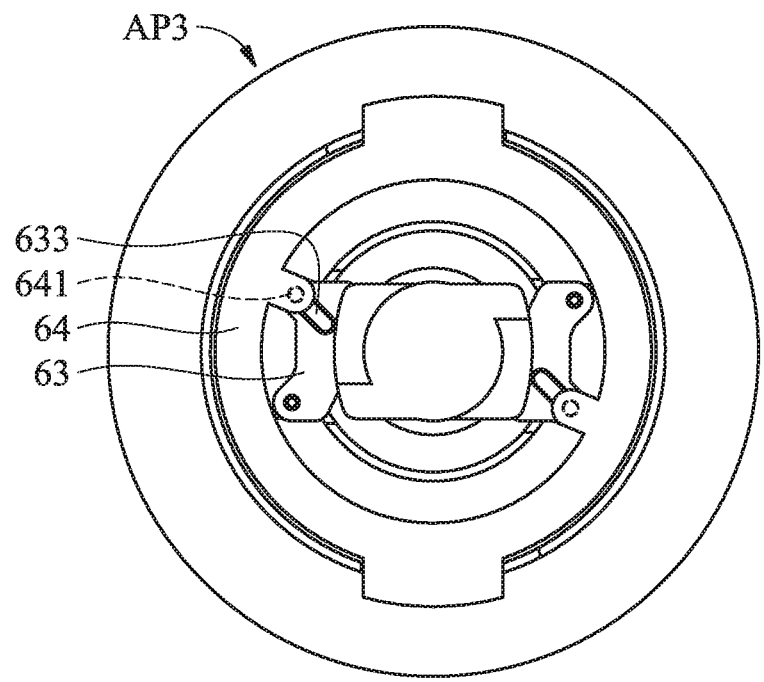
FIGS. 14A and 14B show the object being released from the fastening bracket of the third embodiment of the invention.
Figure 14B:
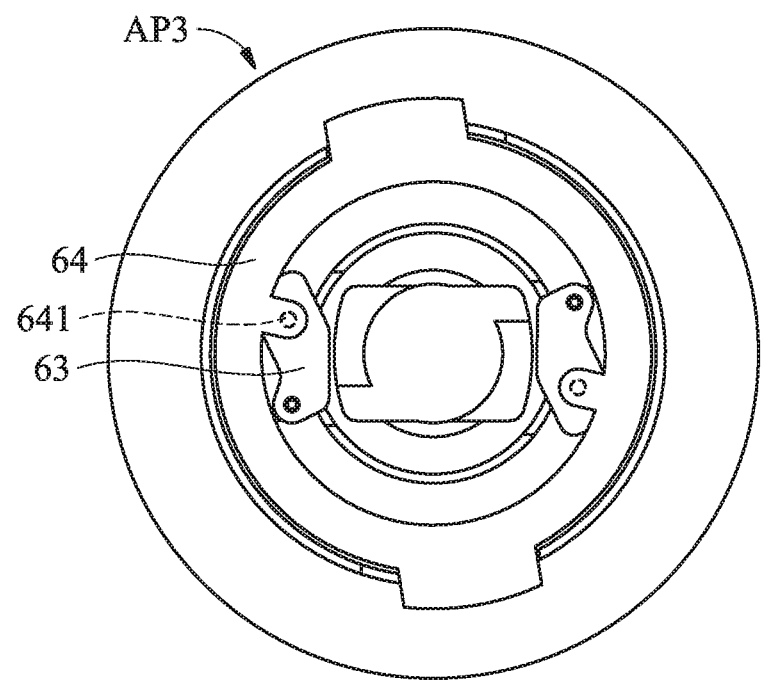

With reference to FIGS. 11A, 14A and 14B, in one embodiment, the connection unit 6 further comprises a turning member 64. The stopper 63 comprises a stopper groove 633. The turning member 64 comprises a post 641. The post 641 is inserted into the stopper groove 633, and the post 641 is slidable along the stopper groove 633. The user can separate the fastening bracket B3 from the object AP3 by pushing the turning member 64.

With reference to FIGS. 11A, 14A and 14B, in one embodiment, the turning member 64 comprises a ring. The post 641 is disposed on the ring. The turning member 64 is configured to be rotated between a first turning member orientation (FIG. 14A) and a second turning member orientation (FIG. 14B). When the turning member 64 is in the first turning member orientation (FIG. 14A), the stopper 63 is in the first stopper orientation. As the turning member 64 is being rotated from the first turning member orientation (FIG. 14A) to the second turning member orientation (FIG. 14B), the post 641 slides in the stopper groove 633, and the post 641 pushes and rotates the stopper 63 to the second stopper orientation. Therefore, the fastening bracket B3 releases the object AP3.

Utilizing the fastening bracket of the embodiments of the invention, the object (for example, wireless router or other electronic device) can be easily fastened to the mounting surface (for example, ceiling). The user only needs to push the object upward (or, with slight rotation) to complete the connection between the object (for example, wireless router) and the fastening bracket. The stability and safety of the connection between the object and the fastening bracket are improved.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fastening bracket, adapted to be affixed to a mounting surface, comprising:
    a base, for being affixed to the mounting surface; and
    a connection unit, connected to the base, wherein the connection unit comprises a unit inclined surface and at least one unit abutting portion,
    wherein an object comprises at least one object abutting portion,
    wherein when the object is in a separated state, the object abutting portion is separated from the unit abutting portion, and when the object is in a connected state, the object abutting portion abuts the unit abutting portion,
    wherein while the object is being moved from the separated state to the connected state, the object abuts the unit inclined surface and slides relative to the unit inclined surface,
    wherein the connection unit comprises a bracket unit, a rotor and a compression spring, the bracket unit is connected with the base, the rotor is rotatably disposed in the bracket unit, one end of the compression spring abuts the base, the other end of the compression spring abuts the rotor, and the unit inclined surface and the unit abutting portion are located on the rotor.

2. The fastening bracket as claimed in claim 1, wherein the object is rotated between a first object orientation and a second object orientation relative to the connection unit and about an axis, when the object is in the first object orientation, the object abutting portion is separated from the unit abutting portion, and when the object is in the second object orientation, the object abutting portion abuts the unit abutting portion to restrict the movement of the object along the axis and relative to the fastening bracket, and during the object's rotation from the first object orientation to the second object orientation, the object abuts the unit inclined surface and slides relative to the unit inclined surface.

3. The fastening bracket as claimed in claim 2, wherein the connection unit comprises a first disc and a second disc, the first disc is connected to the base, the first disc is parallel to the second disc, the unit inclined surface is formed on the first disc and faces the second disc, the unit abutting portion is formed on the second disc and faces the first disc, the second disc comprises at least one disc truncated portion, and when the object is in the first object orientation, the object abutting portion corresponds to the disc truncated portion.

4. The fastening bracket as claimed in claim 3, wherein the object abutting portion comprises a cantilever beam, and during the object's rotation from the first object orientation to the second object orientation, the object abutting portion abuts the unit inclined surface and slides relative to the unit inclined surface.

5. The fastening bracket as claimed in claim 4, wherein the connection unit further comprises a wall and a block, the wall connects the first disc to the second disc, the block is disposed on the second disc and protrudes toward the first disc, and when the object is in the second object orientation, the object abutting portion abuts the unit abutting portion, and the object abutting portion is restricted between the wall and the block.

6. The fastening bracket as claimed in claim 1, wherein the rotor is configured to rotate between a first rotor state and a second rotor state, and when the rotor is in the first rotor state, the object abutting portion is separated from the unit abutting portion, and when the rotor is in the second rotor state, the object abutting portion abuts the unit abutting portion.

7. The fastening bracket as claimed in claim 6, wherein the object comprises a plurality of object inclined structures, the rotor comprises a plurality of rotor inclined structures, the unit inclined surface is formed on at least one of the rotor inclined structures, and while the object is being moved from a first object position to a second object position, the object inclined structures contact the rotor inclined structures and move the rotor, and the rotor is switched between the first rotor state and the second rotor state.

8. The fastening bracket as claimed in claim 7, wherein the rotor further comprises a plurality of wedging protrusions arranged surrounding an axis, the bracket unit comprises a plurality of first walls and a plurality of second walls, the first walls and the second walls are alternately arranged about the axis, and as the rotor is being switched from the first rotor state to the second rotor state, the wedging protrusions respectively pass over the first walls, and as the rotor is being switched from the second rotor state to the first rotor state, the wedging protrusions respectively pass over the second walls.

9. The fastening bracket as claimed in claim 8, wherein the height of the first walls is lower than the height of the second walls, and while the object is being moved from the first object position to the second object position, the rotor is moved from a first rotor height to a second rotor height, and when the rotor is at the second rotor height, the wedging protrusions are higher than the first walls and lower than the second walls.

10. The fastening bracket as claimed in claim 9, wherein when the object is in the second object position, the rotor is pushed from the second rotor height to a third rotor height by rotating the object, and when the rotor is at the third rotor height, the wedging protrusions are higher than the second wall.

11. The fastening bracket as claimed in claim 10, wherein each first wall comprises a first wall guiding surface, each second wall comprises a second wall guiding surface, each wedging protrusion comprises a protrusion guiding surface, and when the wedging protrusion passes over the first wall, the protrusion guiding surface abuts the first wall guiding surface, and when the wedging protrusion passes over the second wall, the protrusion guiding surface abuts the second wall guiding surface.

12. The fastening bracket as claimed in claim 10, wherein the object comprises at least one object restriction slot, the bracket unit comprises at least one bracket restricting protrusion, the bracket restricting protrusion is located in the object restriction slot, and when the object is in the second object position, the bracket restricting protrusion is allowed to be moved along the object restriction slot, the object is further configured to be rotated in a first object rotational direction to move the rotor from the second rotor height to the third rotor height, and when the object is rotated in a second object rotational direction, a side of the object restriction slot abuts the bracket restricting protrusion to prevent the object from being rotated in the second object rotational direction, and the first object rotational direction is opposite to the second object rotational direction.

13. The fastening bracket as claimed in claim 10, wherein the base comprises a base restriction portion, the rotor comprises a rotor restriction portion, and when the base is assembled with the connection unit, the rotor restriction portion abuts the base restriction portion.

14. The fastening bracket as claimed in claim 1, wherein the connection unit comprises a bracket unit, a torsion spring and a stopper, the bracket unit is connected to the base, the stopper pivots on the bracket unit, the stopper comprises a first stopper surface and a second stopper surface, the first stopper surface is opposite to the second stopper surface, the unit inclined surface is formed on the first stopper surface, the unit abutting portion is formed on the second stopper surface, one end of the torsion spring abuts the bracket unit, and the other end of the torsion spring abuts the stopper.

15. The fastening bracket as claimed in claim 14, wherein the object comprises an object plate, the object plate comprises a first plate surface and a second plate surface, the first plate surface is opposite to the second plate surface, an object inclined surface is formed on the first plate surface, and while the object is being moved from a first object position to a second object position, the object inclined surface abuts the unit inclined surface and rotates the stopper.

16. The fastening bracket as claimed in claim 15, wherein the stopper is configured to rotate between a first stopper orientation and a second stopper orientation, while the object is being moved from the first object position to the second object position, the stopper is pushed from the first stopper orientation to the second stopper orientation by the object, and the torsion spring provides an elastic force for moving the stopper from the second stopper orientation to the first stopper orientation, and when the object is in the second object position, the unit abutting portion of the stopper abuts the second plate surface.

17. The fastening bracket as claimed in claim 16, wherein the connection unit further comprises a turning member, the stopper comprises a stopper groove, the turning member comprises a post, the post is inserted into the stopper groove, and the post is slidable along the stopper groove.

18. The fastening bracket as claimed in claim 17, wherein the turning member comprises a ring, the post is disposed on the ring, the turning member is configured to be rotated between a first turning member orientation and a second turning member orientation, and when the turning member is in the first turning member orientation, the stopper is in the first stopper orientation, and during the turning member's rotation from the first turning member orientation to the second turning member orientation, the post slides in the stopper groove, and the post pushes and rotates the stopper to the second stopper orientation.

\* \* \* \* \*